United States Patent [19]

Potthast

[11] Patent Number: 5,903,151

[45] Date of Patent: May 11, 1999

[54] LOCAL ANTENNA ARRANGEMENT FOR A MAGNETIC RESONANCE APPARATUS

[75] Inventor: Andreas Potthast, Forchheim, Germany

[73] Assignee: Siemens Aktiengesellschaft, Munich, Germany

[21] Appl. No.: 08/920,818

[22] Filed: Aug. 29, 1997

[30] Foreign Application Priority Data

Aug. 29, 1996 [DE] Germany ............... 19635029

[51] Int. Cl.$^6$ ............... G01V 3/00
[52] U.S. Cl. ............... 324/318; 324/322
[58] Field of Search ............... 324/322, 318, 324/314, 309, 307, 300; 600/422

[56] References Cited

U.S. PATENT DOCUMENTS

| 4,763,076 | 8/1988 | Arakawa et al. | 324/322 |
| 4,855,680 | 8/1989 | Arakawa et al. | 324/322 |
| 5,144,244 | 9/1992 | Kess | 324/322 |
| 5,245,288 | 9/1993 | Leussler | 324/318 |
| 5,256,972 | 10/1993 | Keren et al. | 324/318 |

FOREIGN PATENT DOCUMENTS

| 42 42 592 | 9/1993 | Germany. |
| 44 40 619 | 8/1995 | Germany. |

*Primary Examiner*—Louis Arana
*Attorney, Agent, or Firm*—Hill & Simpson

[57] ABSTRACT

In a local antenna arrangement for a magnetic resonance apparatus, an antenna structure is connected to a signal generator via an inhibiting circuit. The signal generator is fashioned to generate and emit a detection signal from the radio-frequency signal received from the antenna structure when the local antenna is not connected. The inhibiting circuit is fashioned to electrically decouple the signal generator from the antenna structure when the local antenna is connected.

14 Claims, 1 Drawing Sheet

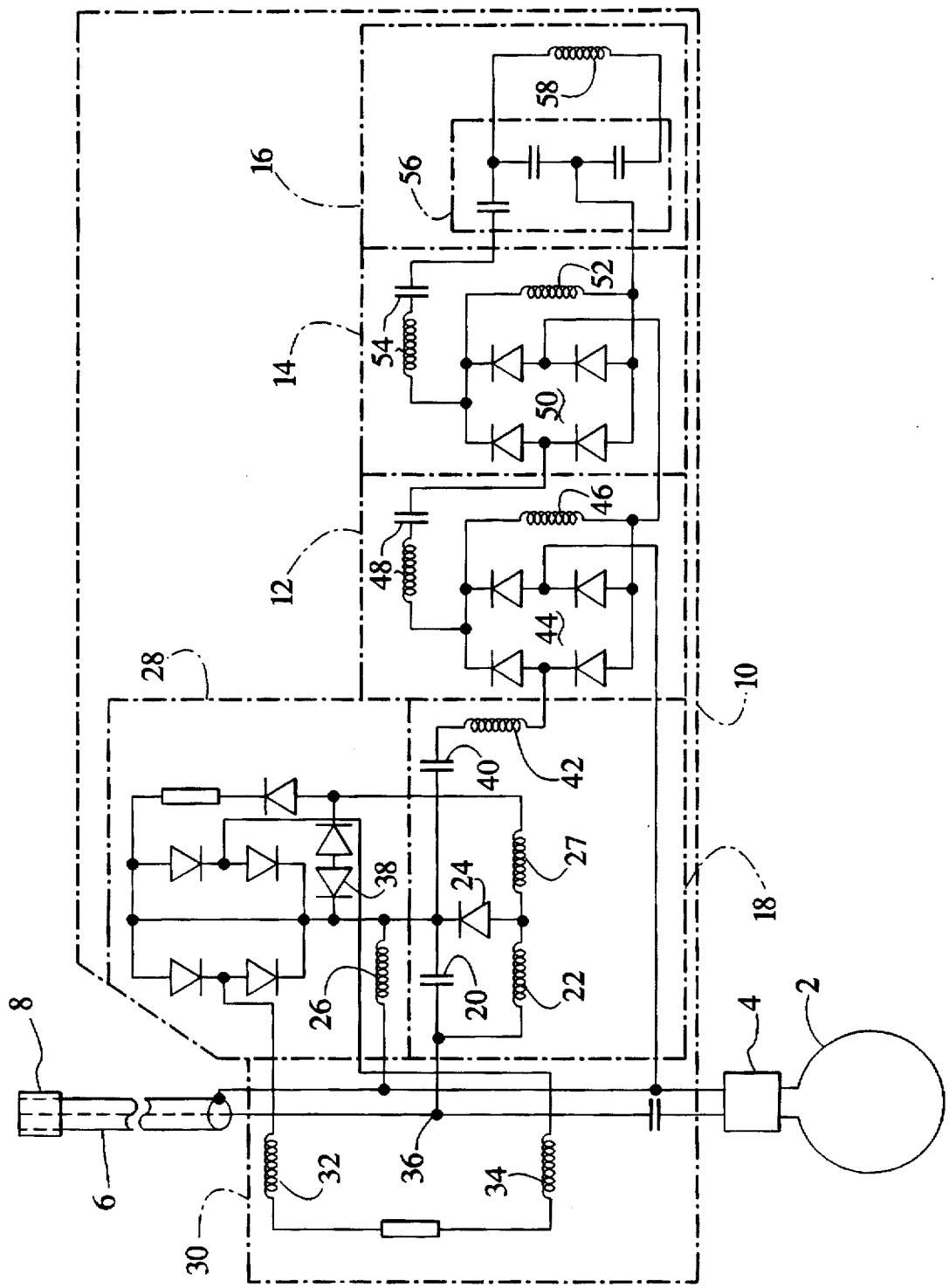

5,903,151

LOCAL ANTENNA ARRANGEMENT FOR A MAGNETIC RESONANCE APPARATUS

BACKGROUND OF THE INVENTION

1. Field of the Invention

The present invention is directed to a local antenna for a magnetic resonance apparatus.

2. Description of the Prior Art

Local antennas are utilized in diagnostic magnetic resonance systems because they deliver a better signal-to-noise ratio compared to whose-body antennas. Due to the more uniform intensity profile, the whole-body antenna is often utilized for the excitation of the nuclear spin procession, with only the resulting magnetic resonance signal being received with the local antenna. In addition to local antennas that are fashioned as receive-only antennas, local antennas for transmitting and for receiving are also employed for specific examinations.

Given proper operation, receive-only local antennas are detuned during the transmission phase of the whole-body antenna, so that a coupling of the local antenna with the whole-body antenna becomes minimal, as disclosed, for example, by U.S. Pat. No. 5,144,244. U.S. Pat. No. 5,256,972 discloses a decoupling of the whole-body transmission antenna, by means of radio-frequency switching diodes inserted into the antenna leads. German OS 42 42 592 discloses the use for decoupling of a second winding with an opposite winding direction connected in addition to the usual winding of the reception coil. Transmit/receive local antennas are usually not operated simultaneously with the whole-body antenna; accordingly, they have no possibility for detuning.

German OS 44 40 619 discloses a radio-frequency antenna that wirelessly forwards the received magnetic resonance signals to the magnetic resonance apparatus.

Problems can arise when a local antenna that is improperly connected to the magnetic resonance apparatus is exposed to the transmission field of the whole-body antenna. Even a receive-only local antenna cannot be detuned in this case, and thus the high-frequency currents induced therein can lead to the destruction of antenna components or to an endangerment of the patient as well. Before the beginning of a measurement, conventionally the operator of the magnetic resonance apparatus must confirm that any local antenna which is present is connected to the magnetic resonance apparatus and that no local antenna in an unconnected condition is located in the magnetic resonance apparatus.

SUMMARY OF THE INVENTION

An object of the present invention is to provide a local antenna arrangement that allows an automatic and risk-free detection when it is not connected to the magnetic resonance apparatus.

This object is achieved in an arrangement having an antenna structure connected to a signal generator via an inhibiting circuit, the signal generator being fashioned to generate a detection signal from a radio-frequency signal received by the antenna structure and to emit it when the local antenna is not connected to the magnetic resonance apparatus, and the inhibiting circuit being fashioned to electrically decouple the signal generator from the antenna structure when the local antenna is connected to the magnetic resonance apparatus.

The detectable local antenna arrangement operates according to the principle of forwarding, in the form of an emitted detection signal, the power induced in the local antenna structure by the radio-frequency field of the whole-body antenna in the unconnected condition. The detection signal can be received by detectors outside the whole-body antenna. By means of a threshold comparison, the presence of an unconnected local antenna can then be reported to the control computer, for example, of the magnetic resonance apparatus. By means of a safety circuit or a safety program, further operation of the magnetic resonance apparatus can then be inhibited until the local antenna is either removed or connected to the magnetic resonance apparatus.

The detection signal can be emitted at the same time that the whole-body antenna sends the radio-frequency signal when, according to an embodiment of the invention, the signal generator is fashioned to impress at least one different characteristic property on the detection signal with reference to the received radio-frequency signal.

The different characteristic property (compared to the electromagnetic radio-frequency signal) can, for example, be that the detection signal is a signal of a different type, for example, an ultrasound signal or a light signal. According to another embodiment, however, the characteristic property can be the frequency of the detection signal. The signal generator can thus be realized simply and dependably.

In another embodiment, the signal generator includes a frequency multiplier circuit and a radiation antenna connected thereto, with the radio-frequency signal being supplied to the frequency multiplier circuit. The higher frequency also allows a miniaturization of the radiation antenna of the signal generator.

According to another embodiment, the frequency multiplier circuit is a frequency doubling circuit. The frequency doubling circuit includes a full-wave rectifier, whereby, according to another embodiment, the output signal is coupled out via a following series resonant circuit tuned to the doubled frequency.

In another embodiment, the inhibiting circuit includes first and second reactance dipoles, the first reactance dipole being arranged in a signal path for the radio-frequency signal, and the second reactance dipole being interconnected with the first reactance dipole via a high-frequency switch element to form a parallel resonant circuit when the local antenna is connected. The parallel resonant circuit is thereby tuned to the actual frequency of the magnetic resonance apparatus. The control signal for the high-frequency switch element is generated by the magnetic resonance apparatus and can therefore only be supplied to the high-frequency switch element when the local antenna is connected. The electrical behavior of a properly connected local antenna is not influenced by the signal generator, which is electrically decoupled at that time.

In another embodiment, a third reactance dipole that forms a series resonant circuit with the first reactance dipole is connected in series with the first reactance dipole. The series resonant circuit is likewise tuned to the actual frequency and takes effect when the second reactance dipole is disconnected from the first reactance dipole via the high-frequency switch element. The radio-frequency signal received by the antenna structure can thus be supplied directly and nearly loss-free to the signal generator.

An equisignal that does not influence the radio-frequency behavior of the local antenna can be employed as control signal for the high-frequency switch element in a further embodiment wherein the high-frequency switch element is connected to a signal line of the antenna side, with a first control signal for activation being supplied to the high-frequency switch element via the connected signal line.

For generating a defined control signal for the deactivation of the high-frequency switch element, in another embodiment includes a rectifier that has its input side connected to a signal outfeed unit and its output side connected to the high-frequency switch element, so that the rectifier generates a second control signal for the high-frequency switch element for the deactivation from the received radio-frequency signal. The signal outfeed unit only couples the rectifier to the antenna structure when the local antenna is not connected. The signal outfeed unit prevents the rectifier from changing the radio-frequency behavior of the local antenna in the connected state.

In a further embodiment, the signal outfeed unit is a series circuit of two coils connected in series antiphase that are arranged so as to be spaced along the signal line of the antenna side, and are thus inductively coupled. The series circuit is connected to the rectifier, and the inhibiting circuit is electrically connected to the signal line of the antenna side between the spaced coils. When the local antenna is properly connected to the magnetic resonance apparatus, a current then flows via the signal line of the antenna side and induces an antiphase signal in the two inductively coupled coils that mutually cancel at the input of the rectifier. When, however, the local antenna is not connected, a current induced in the antenna structure flows via only one of the inductively coupled coils and then into the inhibiting circuit. The signal induced in the coil is rectified and used for the deactivation of the high-frequency switch element, as a result of which the signal provided for rectification continues to be induced in the coupled coil.

DESCRIPTION OF THE DRAWINGS

The single FIGURE shows a circuit diagram of a local antenna arrangement according to the invention for a diagnostic magnetic resonance apparatus that can be automatically detected when it is not connected to the magnetic resonance apparatus.

DESCRIPTION OF THE PREFERRED EMBODIMENTS

The local antenna arrangement shown in the FIGURE includes an antenna structure 2 with an antenna lead that forms a circular conductor loop. The antenna structure 2 is optimized for radiating and/or receiving an electromagnetic radio-frequency field at the actual frequency of the magnetic resonance apparatus. The actual frequency lies in the MHZ range and amounts to approximately 63 MHZ given a 1.5 T apparatus. The antenna structure 2 is electrically connected to a signal transmission line 6 via a tuning and matching circuit 4. The tuning and matching circuit 4 matches the antenna structure to the characteristic impedance of the signal transmission line 6, as well as allowing an exact tuning to the actual frequency of the magnetic resonance apparatus, particularly given detunings due to the load represented by the patient under examination. Here, the signal transmission line 6 is permanently connected to the local antenna. In this case, a plug part 8 via which the local antenna can be releasably electrically connected to the magnetic resonance apparatus is connected to the end of the signal line. An alternative connection possibility (not shown here) is to permanently connect the signal transmission line 6 to the magnetic resonance apparatus. A plug part is then connected to the distal end of the signal transmission line 6 and a corresponding receptacle for the plug part is arranged at the local antenna 2.

The signal transmission line 6, either by permanent connection or via the plug 8, leads to a conventional RF unit (not shown) of the magnetic resonance apparatus which is operable in a transmit mode to generate RF signals for exciting nuclear spins in an examination subject, and in a reception mode for receiving the resulting nuclear magnetic resonance signals.

In both connection types, a circuit 10 for generating a detection signal when the local antenna is not connected to the magnetic resonance apparatus is permanently connected to the local antenna. The circuit 10 does not require its own power supply, for example in the form of batteries or the like, for generating the detection signal. Instead, the working principle is that a part of the radio-frequency power emitted by a whole-body antenna is in turn radiated by the local antenna at a different frequency in the unconnected condition. Here, the circuit 10 emits a detection signal at four time the actual frequency of the magnetic resonance apparatus, at 252 MHZ.

The circuit can be divided into five function blocks. Two series-connected frequency doubling circuits 12 and 14 are provided as a signal generator for generating the detection signal from the received radio-frequency signal. The signal generator also includes a radiating antenna 16 that is connected to the output of the second frequency doubling circuit 14 for transmitting the detection signal. An inhibiting circuit 18 is arranged between the signal line 6 of the antenna side and the signal generator (composed to doubling circuits 12 and 14 and the antenna 16) this inhibiting circuit 18 being fashioned to electrically disconnect the signal generator from the antenna structure 2 when the local antenna is connected to the magnetic resonance apparatus. The inhibiting circuit 18 includes a capacitive element 20 and an inductive element 22 that can be interconnected via a high-frequency switching diode, for example a PIN diode, to form a parallel resonant circuit. The parallel resonant circuit formed by the capacitive element 20 and the inductive element 22 has a resonant frequency at the actual frequency of the magnetic resonance apparatus and therefore operates as a blocking circuit. A control signal for the activation of the high-frequency switching diode 24 in the form of a direct current can only flow from the magnetic resonance apparatus back to the magnetic resonance apparatus, via the plug 8, the signal transmission line 6 and the inductive element 22 to the high-frequency switching diode 24 and via a high-frequency stop choke 26 in the connected condition of the local antenna. The high-frequency stop choke 26 represents an extremely high impedance at the actual frequency of the magnetic resonance apparatus and suppresses high-frequency currents between the two signal lines of the antenna side. A further high-frequency stop choke 27 is also provided for blocking high-frequency currents. A rectifier 28 is also provided as fifth function unit, this generating an inhibit signal for the high-frequency switching diode 24 from the radio-frequency signal received from the antenna structure 2 when the local antenna is not connected to the magnetic resonance apparatus. To that end, the rectifier has its input side connected to a signal outfeed unit 30 that functionally couples the rectifier 28 to the antenna structure 2 only when the local antenna is not connected. The signal outfeed unit 30 includes a circuit of two coils 32 and 34, connected in series antiphase, that are arranged spaced along the signal line of the antenna side and are thus inductively coupled. The inhibiting circuit 18 is electrically connected to the signal line 6 of the antenna side at a terminal 36 placed spatially between the coils 32 and 34. When the local antenna is connected to the magnetic resonance apparatus, a high-frequency current flowing on the signal line 6 induces respective voltages in both coils 32 and 34 that are of the same size but antiphase. The sum of the two voltages at the input of the rectifier 28 just cancels, so that no inhibit voltage can be generated for the high-frequency switching diode 24.

Consequently, the circuit for generating a detection signal is completely decoupled from the antenna structure 2 when the local antenna is connected to the magnetic resonance apparatus. First, the signal outfeed unit 30 cannot supply an input voltage for the rectifier 28, and second the signal generator is connected to the antenna structure 2 only via the extremely high impedance of the parallel resonant circuit 20 and 22 that is in resonance. The parallel resonant circuit is formed by the two reactance dipoles 20 and 22 on the basis of a control signal for the switching diode 24 that is generated by the magnetic resonance apparatus and supplied via the signal line 6.

In the non-connected condition, the power induced in the local antenna structure cannot flow in the direction of the coil plug 8. A slight part of the power of the received radio-frequency signal is then supplied via the terminal 36 into the connected detection circuit, causing a voltage to be induced only in the coil 34. The induced voltage is rectified by the rectifier 28 and is supplied to the high-frequency switching diode 24 as a blocking voltage. The rectifier 28 is constructed as a full-wave rectifier, and a Zener diode 38 limits the maximum voltage of the rectifier 28.

The inhibited high-frequency switching diode 24 disconnects the inductive element 22 from the capacitive element 20 at one side. Together with a further capacitive element 40 and an inductive element 42, the capacitive element 20 thus forms a series resonant circuit that has a resonance point at the actual frequency of the magnetic resonance apparatus. The further capacitive element 40 also serves for DC decoupling the signal generator from the rectifier 28 and from the control signal for the activation of the switching diode 24. The first frequency doubling circuit 12 is composed of a full-wave rectifier 44 that is shorted in terms of DC via a choke 44 and is connected to the second frequency doubling circuit 14 via a series resonant circuit 48 tuned to double the frequency, 126 MHZ here. The second frequency doubling circuit 14 is likewise composed of a full-wave rectifier 50 that is shorted in terms of DC by a choke 52. The detection signal with four time the high-frequency signal generated in this way is supplied to the radiating antenna 16 via a correspondingly tuned, further series resonant circuit 54. For tuning and matching, the radiating antenna 16 also includes a tuning and matching circuit 56 in addition to an antenna lead 58.

Before the start of an MR measurement sequence, a radio-frequency pulse with a low, non-hazardous amplitude is emitted via the whose-body antenna. If an unconnected local antenna 2 with the above-described detection circuit is located in the transmission field of the whole-body antenna, the received radio-frequency signal is converted into a different frequency range and is in turn radiated. Detectors or receivers at both ends of the whole-body antenna receive the detection signal and inform the magnetic resonance apparatus that the local antenna is not connected to the magnetic resonance apparatus.

The detection circuit can be utilized for transmit/receive antennas as well as for receive-only antennas.

Although modifications and changes may be suggested by those skilled in the art, it is the intention of the inventor to embody within the patent warranted hereon all changes and modifications as reasonably and properly come within the scope of his contribution to the art.

I claim as my invention:

1. A local antenna for a magnetic resonance apparatus comprising:

an antenna structure;

means for releasably electrically connecting said antenna structure to a magnetic resonance apparatus;

an inhibiting circuit;

signal generator means connected to said antenna structure via said inhibiting circuit for generating and emitting a detection signal from a radio-frequency signal received by said antenna structure if said radio-frequency signal is received by said antenna structure when said antenna structure is not connected to said magnetic resonance apparatus; and said inhibiting circuit comprising means for electrically decoupling said signal generator means from said antenna structure when said antenna structure is connected to said magnetic resonance apparatus.

2. A local antenna as claimed in claim 1 wherein said radio-frequency signal has a characteristic property, and wherein said signal generator means comprises means for impressing at least one different characteristic property on said detection signal, relative to said characteristic property of said radio-frequency signal.

3. A local antenna as claimed in claim 2 wherein said different characteristic property of said detection signal is a frequency of said detection signal.

4. A local antenna as claimed in claim 3 wherein said signal generator means comprises a frequency multiplier circuit connected to a radiating antenna which emits said detector signal in the form of a radiated detector signal, said frequency multiplier circuit being supplied with said radio-frequency signal received by said antenna structure.

5. A local antenna as claimed in claim 4 wherein said frequency multiplier circuit comprises a frequency doubling circuit.

6. A local antenna as claimed in claim 5 wherein said frequency doubling circuit comprises a full-wave rectifier acting on said radio-frequency signal, followed by a series resonant circuit.

7. A local antenna as claimed in claim 6 wherein said frequency doubling circuit comprises a first frequency doubling circuit, and wherein said frequency multiplier circuit comprises a second frequency doubling circuit connected in series following said first frequency doubling circuit.

8. A local antenna as claimed in claim 7 wherein said full wave rectifier comprises a first full wave rectifier and wherein said series resonant circuit comprises a first series resonant circuit, and wherein said second frequency doubling circuit comprises a second full wave rectifier and a following second series resonant circuit.

9. A local antenna as claimed in claim 1 wherein said inhibiting circuit comprises a first reactance dipole and a second reactance dipole, said first reactance dipole being connected in a signal path for said radio-frequency signal received by said antenna structure, and a controllable high-frequency switching means for connecting said second reactance dipole to said first reactance dipole to form a parallel resonant circuit when said antenna structure is connected to said magnetic resonance apparatus.

10. A local antenna as claimed in claim 9 further comprising a third reactance dipole connected in series with said first reactance dipole.

11. A local antenna as claimed in claim 10 further comprising at least one high-frequency choke connected between said high-frequency switching element and said means for releasably connecting said antenna structure to said magnetic resonance apparatus, said means for releasably connecting said antenna structure to said magnetic resonance apparatus supplying an activation signal to said high-frequency switching means.

12. A local antenna as claimed in claim 11 wherein said high-frequency switching means comprises a high-frequency switching diode.

13. A local antenna as claimed in claim 11 further comprising an outfeed unit and a rectifier having an input side connected to said outfeed unit and an output side connected to said high-frequency switching means, said rectifier generating a deactivation signal for said high-frequency switching means from said radio-frequency signal received by said antenna structure, and said outfeed unit comprising means for coupling said rectifier to said antenna structure only when said antenna structure is not connected to said magnetic resonance apparatus.

14. A local antenna as claimed in claim 13 wherein said means for releasably connecting said antenna structure to said magnetic resonance apparatus includes a signal line, and wherein said outfeed unit comprises a series circuit of two coils connected in series antiphase disposed spaced apart along said signal line so that said two coils are inductively coupled, said series circuit being connected to said rectifier, and said inhibiting circuit being electrically connected to said signal line between said two coils.

* * * * *